(12) United States Patent
Shankar et al.

(10) Patent No.: US 7,900,174 B2
(45) Date of Patent: Mar. 1, 2011

(54) METHOD AND SYSTEM FOR CHARACTERIZING AN INTEGRATED CIRCUIT DESIGN

(75) Inventors: Rajiv Shankar, Uttar Pradesh (IN); Kousik Mukherjee, Uttar Pradesh (IN); Naveen Chandra Srivastava, Uttar Pradesh (IN); Shelly Adhikari, Uttar Pradesh (IN); Richa Gupta, Uttaranchal (IN); Rajat Chopra, Delhi (IN)

(73) Assignee: Interra Systems Inc, San Jose, CA (US)

( * ) Notice: Subject to any disclaimer, the term of this patent is extended or adjusted under 35 U.S.C. 154(b) by 514 days.

(21) Appl. No.: 12/152,932

(22) Filed: May 19, 2008

(65) Prior Publication Data
US 2009/0288055 A1 Nov. 19, 2009

(51) Int. Cl.
*G06F 17/50* (2006.01)
(52) U.S. Cl. .......... 716/108; 716/104; 716/106; 716/110
(58) Field of Classification Search .................. None
See application file for complete search history.

(56) References Cited

U.S. PATENT DOCUMENTS

| | | | | |
|---|---|---|---|---|
| 5,555,201 A | * | 9/1996 | Dangelo et al. | 716/102 |
| 5,801,958 A | * | 9/1998 | Dangelo et al. | 716/102 |
| 5,896,300 A | * | 4/1999 | Raghavan et al. | 716/113 |
| 6,286,126 B1 | * | 9/2001 | Raghavan et al. | 716/113 |
| 6,813,201 B2 | * | 11/2004 | Zarrineh et al. | 365/201 |

OTHER PUBLICATIONS

Agarwal et al., "System-Level Modeling Environment: MLDesigner," Syscon 2008—IEEE Int'l Syste,s Conference, Montreal, Canada, Apr. 7-10, 2008, 7 pages.*
Jayadevappa et al., "A Comparative Study of Modeling at Different Levels of Abstraction in System on Chip Designs: A Case Study," Proc. of IEEE Computer Society Annual Symposium on VLSI Emerging Trends in VLSI Systems Design (ISVLS'04), 2004, 7 pages.*
Zarrineh et al., "Automatic Generation and Validation of Memory Test Models for High Performance Microprocessors," 2001 IEEE, pp. 526-529.*

* cited by examiner

*Primary Examiner* — Leigh Marie Garbowski

(57) ABSTRACT

A method and a system for characterizing an integrated circuit (IC) design are disclosed. The method includes receiving a description of leaf cells used in the IC design. The IC design is described in a high-level language by using the description of the leaf cells. The description of the IC design includes specifying placement of the leaf cells and specifying connectivity between them. Further, the method includes extracting a circuit netlist file based on the physical layout of the IC design. The instructions are defined in the high-level language to perform simulations on the extracted circuit netlist file. These simulations are performed on the circuit netlist file to determine the values of the design parameters. Furthermore, the method includes providing the values of the design parameters of the IC design in a pre-defined output format based on the simulations.

17 Claims, 11 Drawing Sheets

Characterization Result

| Process = typ | Temp = 50.000000 | Vol = 4.000000 | |
|---|---|---|---|
| TimingParam Name | Slew1 | Slew2/Load | TimingParam_Value |
| tFall_Time_clk | 0.100000 | 0.100000 | 2.295e-10 |
| tFall_Time_clk | 0.100000 | 0.200000 | 2.295e-10 |
| tDelay_clk_Dout | 0.100000 | 0.100000 | 2.233e-07 |
| tDelay_clk_Dout | 0.100000 | 0.200000 | 2.233e-07 |
| tRise_Time_clk | 0.100000 | 0.100000 | 1.898e-09 |
| tRise_Time_clk | 0.100000 | 0.200000 | 1.898e-09 |

METHOD AND SYSTEM FOR CHARACTERIZING AN INTEGRATED CIRCUIT DESIGN

FIELD OF THE INVENTION

The present invention relates generally to automated tools for designing integrated circuits (ICs). More specifically, it relates to a method and system for characterizing the design parameters of an IC design.

BACKGROUND OF THE INVENTION

In System on a Chip (SOC) designs, an integrated circuit (IC) is designed by using automated tools. A circuit netlist is generated by using automated Electronic Design Automation (EDA) tools. The circuit netlist is a hierarchical transistor-level description of circuit building blocks and is used with leaf cells to design an IC. A leaf cell is a basic building block with one or more transistors that can be used in a design. The basic circuit building blocks, described in the netlist, are integrated onto a single integrated chip. These circuit building blocks include, but are not limited to, microprocessors, field-programmable gate arrays (FPGAs), memories, digital application-specific integrated circuits (ASICs), operational amplifiers (op-amps), linear regulators, phase-locked loops, oscillators and active filters. The IC design is rigorously characterized with respect to several design parameters, according to IC design rules, to ensure that circuit-building blocks operate in the expected manner in the IC design. These design parameters include, but are not limited to, the timing parameter and the power parameter.

In traditional methods for characterizing the design parameters of an IC design, the circuit netlist file provides a description of the circuit building blocks, their connections, and some of their attributes. The circuit netlist file includes a symbolic representation of the circuit building blocks. Further, the circuit designer has to describe the circuit building blocks for every unique IC design. Therefore, a need exists for a method and system for characterizing an IC design wherein the circuit netlist can be easily modified by a user during the design cycle. There also exists a need for developing a method and system for generating a generic/parameterized description of circuit-building blocks that can be used in different IC designs.

SUMMARY OF THE INVENTION

The present invention discloses a method for characterizing an IC design. The method includes receiving a description of one or more leaf cells used in the IC design. The IC design is described in a high-level language by using the description of the one or more leaf cells. The description of the IC design includes specifying placement of the one or more leaf cells, and specifying connectivity between the one or more leaf cells. Further, the method includes developing a physical layout design, based on the high-level language description. Thereafter, a critical path of the IC is extracted, based on its physical layout. A circuit netlist file is extracted, based on the extracted critical path of the IC. Thereafter, instructions are defined in the high-level language to perform one or more simulations on the extracted circuit netlist file. These one or more simulations are performed on the circuit netlist file to determine one or more values for one or more design parameters. Furthermore, the method includes providing one or more values for one or more design parameters of the IC design in a pre-defined output format, based on the one or more simulations.

The present invention also discloses a circuit characterization system for characterizing an IC design. The circuit characterization system includes a circuit description generator, which describes the IC design in a high-level language by using a description of one or more leaf cells. The description of the IC design includes specifying placement of the one or more leaf cells and specifying connectivity between the one or more leaf cells. The circuit characterization system also includes a simulation instruction generator, which generates instructions in the high-level language based on a circuit netlist file. The generated instructions are used to generate a test file. Further, the circuit characterization system includes a circuit simulator, which performs one or more simulations on the circuit netlist file based on the instructions defined in the high-level language. These one or more simulations are performed to determine one or more values of one or more design parameters. Furthermore, the circuit characterization system includes an output generator, which provides the one or more values of a design parameter in a pre-defined output format based on the one or more simulations.

BRIEF DESCRIPTION OF THE FIGURES

The accompanying figures, where like reference numerals refer to identical or functionally similar elements throughout the separate views, and which, together with the detailed description below, are incorporated in and form part of the specification, serve to further illustrate various embodiments and explain various principles and advantages, all in accordance with the present invention.

The embodiments of the invention will hereinafter be described in conjunction with the appended drawings, provided to illustrate and not to limit the invention, wherein like designations denote like elements, and in which:

FIGS. 5, 6 and 7 illustrate exemplary outputs, in accordance with an embodiment of the present invention;

DETAILED DESCRIPTION OF THE INVENTION

Figure 1:
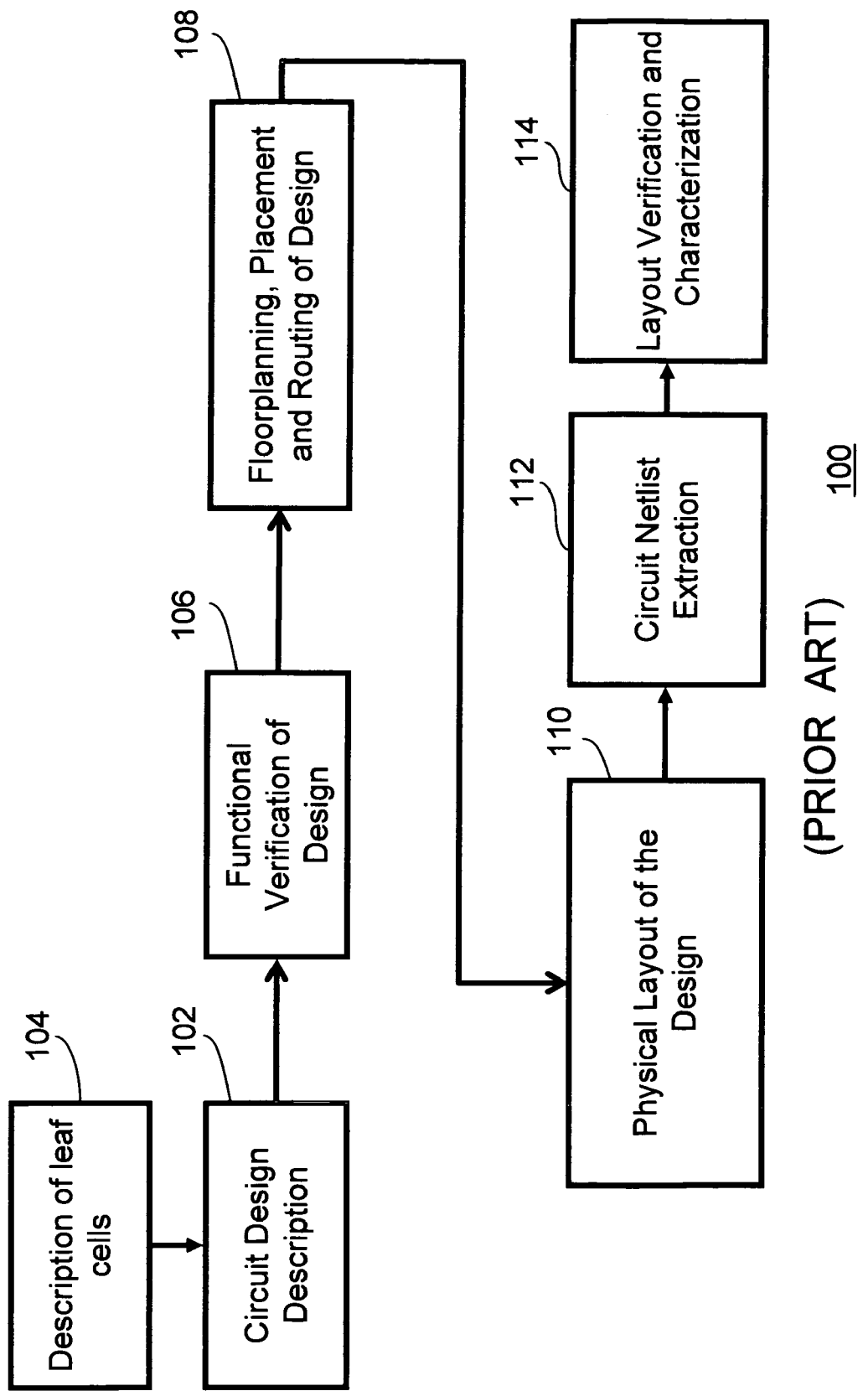
FIG. 1 is a block diagram illustrating an exemplary description of the methodology used in designing custom integrated circuits.

Before describing in detail the particular method used for characterizing an IC design in accordance with various embodiments of the present invention, it should be observed that the present invention utilizes a combination of method steps and apparatus components related to the method for characterizing the IC design. Accordingly, the apparatus components and method steps have been represented, where appropriate, by conventional symbols in the drawings, showing only those specific details that are pertinent for an understanding of the present invention, so as not to obscure the disclosure with details that will be readily apparent to those with ordinary skill in the art, having the benefit of the description herein.

In this document, the terms 'comprises,' 'comprising,' 'includes,' 'including,' or any other variation thereof, are intended to cover a non-exclusive inclusion, such that a process, article, system or apparatus that comprises a list of elements does not include only those elements, but may include other elements not explicitly listed or inherent to such a process, article or apparatus. The term 'another', as used in this document, is defined as at least a second or more. The terms 'includes' and/or 'having', as used herein, are defined as comprising.

FIG. 1 is a block diagram illustrating an exemplary description of the methodology used in designing custom ICs. Block diagram 100 shows a circuit design description 102 as the starting point for describing, a circuit design. The circuit can be described by using automated tools such as schematic editors. The circuit design description 102 uses descriptions of leaf cells 104 as input. The leaf cell is a basic building block having one or more transistors that can be used in a design. Examples of a leaf cell include, but are not limited to, a group of transistors describing a simple functional logical operation such as an AND gate, an OR gate, and a comparator. Circuit designers use a methodology in which leaf cells stored in the design library are used in the IC design during the placement and routing phase of the design. A functional description of the IC design is generated by the designer by using the description of leaf cells 104. The functional description is then verified, as shown by the block 106. The functional verification of design 106 includes applying test vectors to the functional description and performing simulations to ensure conformance to the required design logic. The circuit designer then uses the functional description to describe floorplanning, placement and routing of the design as illustrated by block 108.

Floorplanning is mapping between the leaf cells and the circuit building blocks described in the functional description. The objective of floorplanning is to decide the location of the input/output pads and the power pads of the IC design. The geometric limitations of the design are taken care of in floorplanning, to minimize the IC design area and the interconnect delay between the circuit building blocks. Placement is the next step in the design and is the process of assigning location to the circuit building blocks in the IC design. The main objective of placement is to ensure that that the length of the wire connections in the routing stage are minimized by optimally locating the circuit building blocks. In the routing phase, all the placed circuit building blocks are connected by wires to ensure conformity to EDA design rules.

A physical layout of the IC design 110 is the outcome of floorplanning, placement and routing of the design 108. A circuit netlist is extracted 112 from the physical layout of the IC design 110 by using automated Electronic Design Automation (EDA) tools. The circuit netlist is a hierarchical transistor-level description of circuit building blocks. Thereafter, layout verification and characterization 114 is performed to validate the original schematic or circuit diagram of the IC design. Layout verification and characterization involves, but is not limited to, a design rule check, a layout versus schematic check, and an electrical rule check. The IC design is rigorously verified and characterized with respect to several design parameters to ensure that the circuit building blocks operate in an optimal manner according to the IC design rules. For example, if the circuit design description 102 suggests that the timing parameter of the IC design is less than 5 nanoseconds (ns), the layout verification and characterization tools characterize the timing parameter of the layout to ensure that it is functioning as expected and the value of the timing parameter is less than 5 ns.

Figure 2:
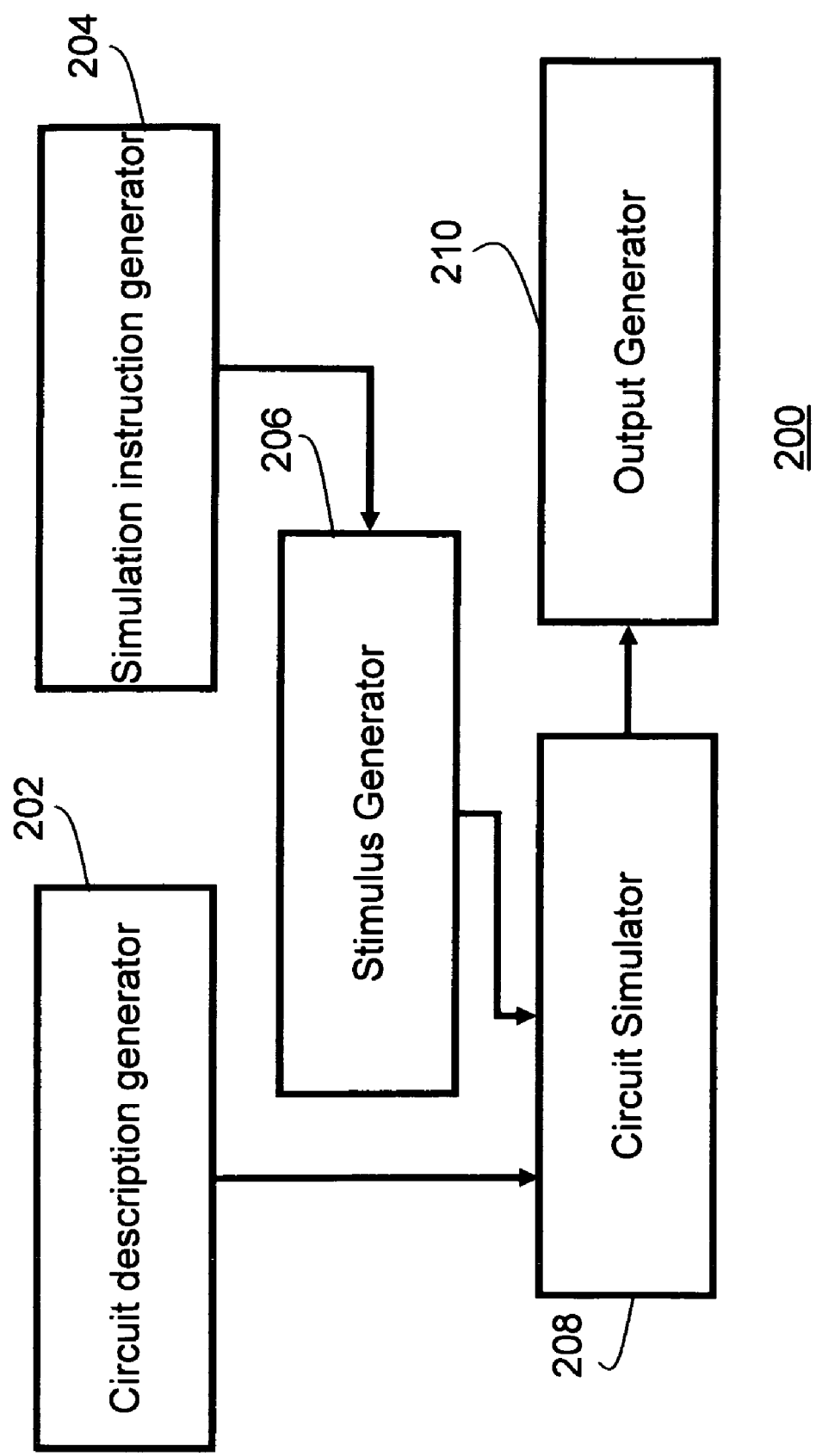
FIG. 2 illustrates a functional block diagram of a circuit characterization system in accordance with an embodiment of the present invention.

FIG. 2 illustrates a functional block diagram of a circuit characterization system 200, in accordance with an embodiment of the present invention. The circuit characterization system 200 includes a circuit description generator 202, a simulation instruction generator 204, a stimulus generator 206, a circuit simulator 208, and an output generator 210.

Figure 3:
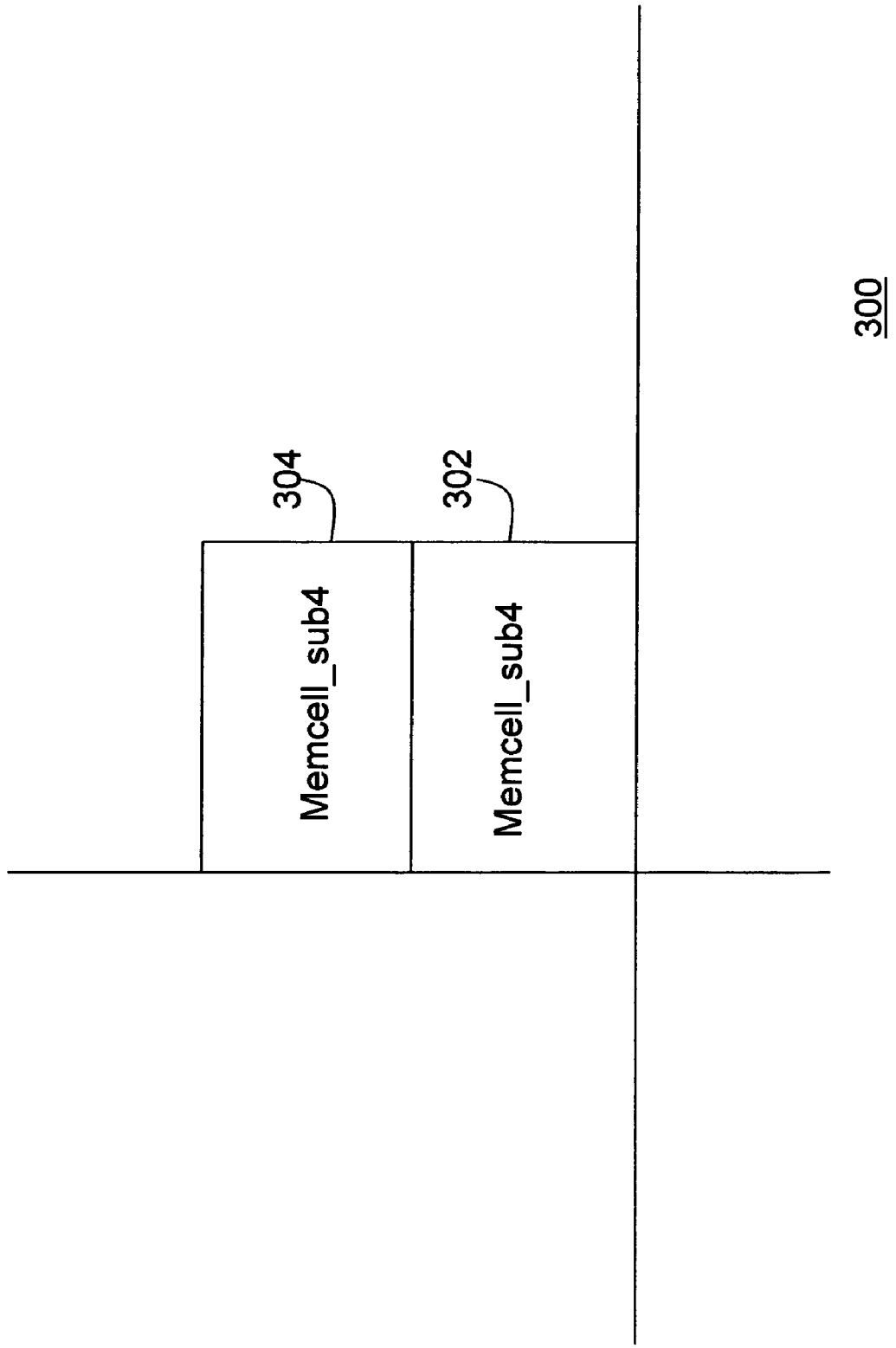
FIG. 3 illustrates an exemplary output generated by the placement section of the Memory Description Language (MDL), in accordance with an embodiment of the present invention.
Figure 4:
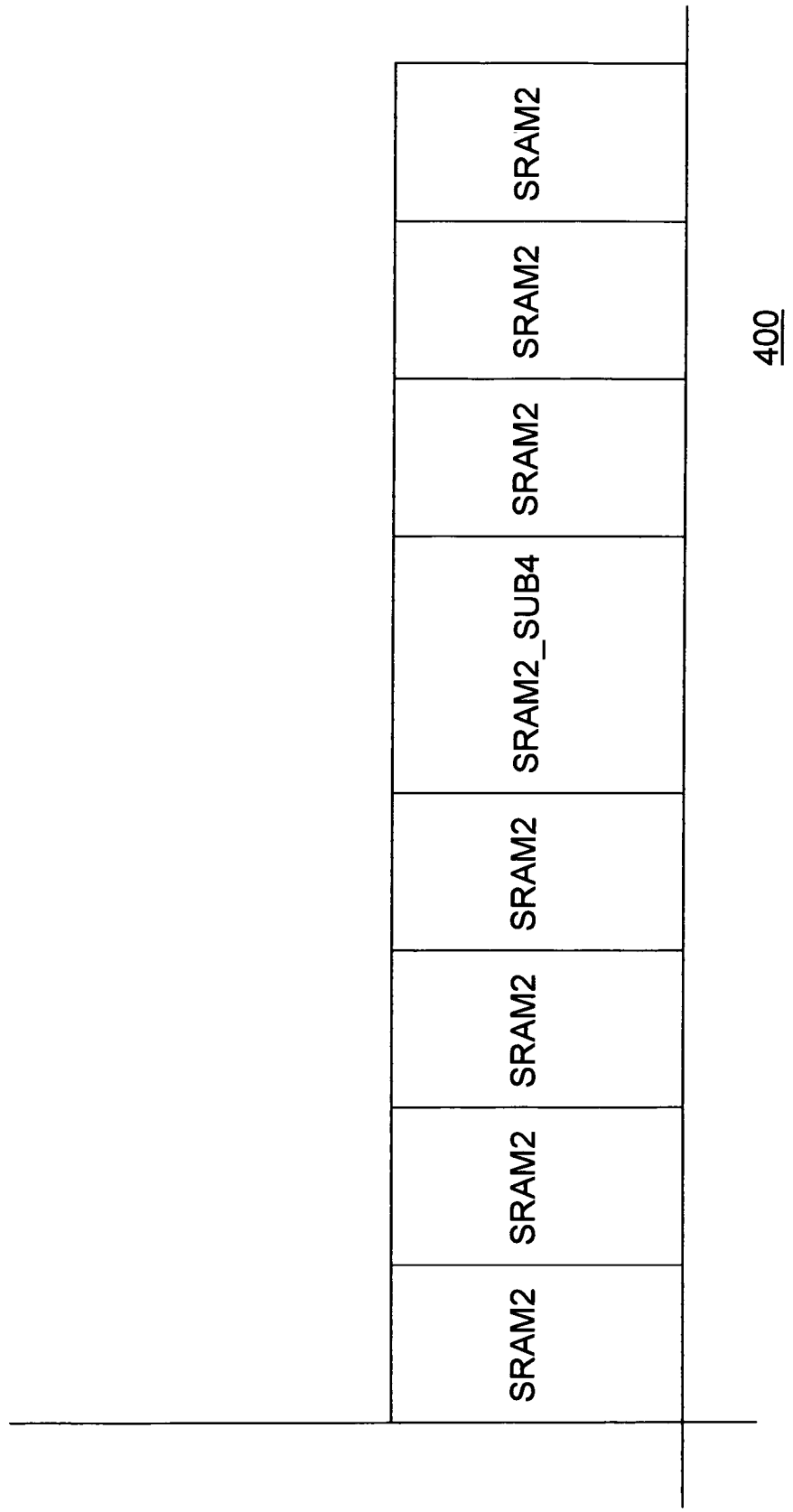
FIG. 4 illustrates an exemplary output generated by the placement section of the Memory Description Language (MDL), in accordance with another embodiment of the present invention.

The circuit description generator 202 describes the IC design in a high-level language by using a description of one or more leaf cells. High-level language is a programming language that is used at the higher level of abstraction from machine languages. It is easy to use and easily portable across various platforms. Further, the high-level language deals with variables, arrays and complex arithmetic or boolean expressions. In a custom circuit design, the commonly used methodology followed by circuit designers is to describe the design in the form of a schematic diagram. This design is then simulated for functional verification. Thereafter, industry standard layout tools are used for physically placing and routing the schematic-driven design. Nowadays, instead of designing circuits from scratch, circuit designers use a methodology in which the description of leaf cells stored in the design library are used in the design during the placement and routing phase of the design. In an embodiment of the present invention, the high-level language used to describe the design is Memory Description Language (MDL). The MDL is a perl-like high-level programming language that includes a library of commands to describe the placement of the description of the leaf cells and the connectivity between the leaf cells to develop a physical layout of the IC. Hereinafter, the high-level language is referred to as MDL. Exemplary outputs generated by the placement section of the MDL are shown in FIG. 3 and FIG. 4. APPENDIX A lists an exemplary description of placement of the leaf cells in the MDL. The circuit description generator 202 is also capable of extracting a critical path from the physical layout of the IC. The critical path is the part of the physical layout of the IC that has delay time and power dissipation more than any other part of the physical layout. Extraction of the critical path is done because the accuracy of characterization data is extremely important for memory circuits on the critical path of the physical layout of the IC. In the present invention, critical path is extracted from the physical layout of IC using the MDL. The critical path in the MDL is extracted by fracturing the MDL of the physical layout of the IC into three parts, the critical path MDL, the MDL of the circuit which loads the critical path, and the MDL of the rest of the IC. The circuit description generator 202 saves the connectivity information between the critical path and the circuit which loads the critical path to connect them later. This connectivity information is extracted from the physical abutment of the leaf cells at the interface between the critical path and the circuit which loads the critical path. EDA tools are used to extract a lumped-RC equivalent of the circuit which loads the critical path. The collected information is saved by the circuit description generator 202. The circuit description generator 202 then connects the critical path circuit with the lumped-RC equivalent of the circuit which loads the critical path using the connectivity information stored by the circuit description generator 202. A circuit netlist file is then extracted from the thus obtained circuit.

The simulation instruction generator 204 generates instructions in the MDL based on the extracted circuit netlist file. These instructions are generated to perform one or more simulations on the circuit netlist file. Based on the instructions generated by the simulation instruction generator 204, the stimulus generator 206 generates a test file for performing the one or more simulations. In one embodiment, the simulation instruction generator 204 can generate and edit the instructions by using a Graphical User Interface (GUI).

Based on the instructions defined by the simulation instruction generator 204, the circuit simulator 208 performs the one or more simulations on the circuit netlist file. These one or more simulations are performed to determine one or more values for one or more design parameters. These one or more design parameters include, but are not limited to, one or more timing parameters, and one or more power parameters. The one or more timing parameters include, but are not limited to, the setup time, hold time, access time, minimum pulse high and low time, and other input/output pin characteristics. APPENDIX A lists exemplary instructions defined by the simulation instruction generator 204 in the MDL. The output generator 210 provides the one or more values of the design parameter in a pre-defined output format based on the one or more simulations. In one embodiment, the pre-defined output format is user-defined. The exemplary outputs are shown in FIG. 5, FIG. 6 and FIG. 7.

FIG. 3 illustrates an exemplary output 300 generated by the placement section of the MDL in accordance with an embodiment of the present invention. APPENDIX A lists an exemplary description of placement of the leaf cells in the MDL. The exemplary output 300 is generated in a coordinate system by the placement section of block SRAM2_SUB4 which is included in APPENDIX A. The placement of the memory block SRAM2_SUB4 in the coordinate system is defined by the 'place' statement. The syntax of the 'place' statement is place(<block>, <x coordinate>, <y coordinate>, <rotation>, <mirror>). The block 302 placed at the origin is generated by place($SRAM_SUB4, 0, 0). Further, the block 304 is generated by place($SRAM_SUB4, 0, height($SRAM_SUB4), R0, MX). As represented in the exemplary output 300, the blocks 302 and 304 take values as Memcell_sub4 when the 'place' statement is executed. The block 304 is rotated by zero degrees with reference to the coordinate system, as specified by RO. Further, the block 304 is mirrored with reference to the x-axis of the coordinate system, as specified by Mx. It should be understood by a person ordinarily skilled in the art that the description of the placement of the leaf cells discussed above is only exemplary and can be implemented with reference to any other embodiment of the present invention.

FIG. 4 illustrates an exemplary output 400 generated by the placement section of the MDL in accordance with another embodiment of the present invention. APPENDIX A lists an exemplary description of placement of the leaf cells in the MDL. The exemplary output 400 is generated in a coordinate system by the placement section of the block TOP which is included in APPENDIX A. The exemplary output 400 is generated along the x-axis of the coordinate system by using the 'array' statement. The 'array' statement is defined using a 'pattern' statement. The 'pattern' statement defines a pattern of placement of the leaf cells. The 'pattern' statement is further defined using 'sub' statements to place multiple instances of SRAM2 block and a single instance of SRAM2_SUB4 block. It should be understood by a person ordinarily skilled in the art that the description of the placement of the leaf cells discussed above is only exemplary and can be implemented with reference to any other embodiment of the present invention.

Figure 6:
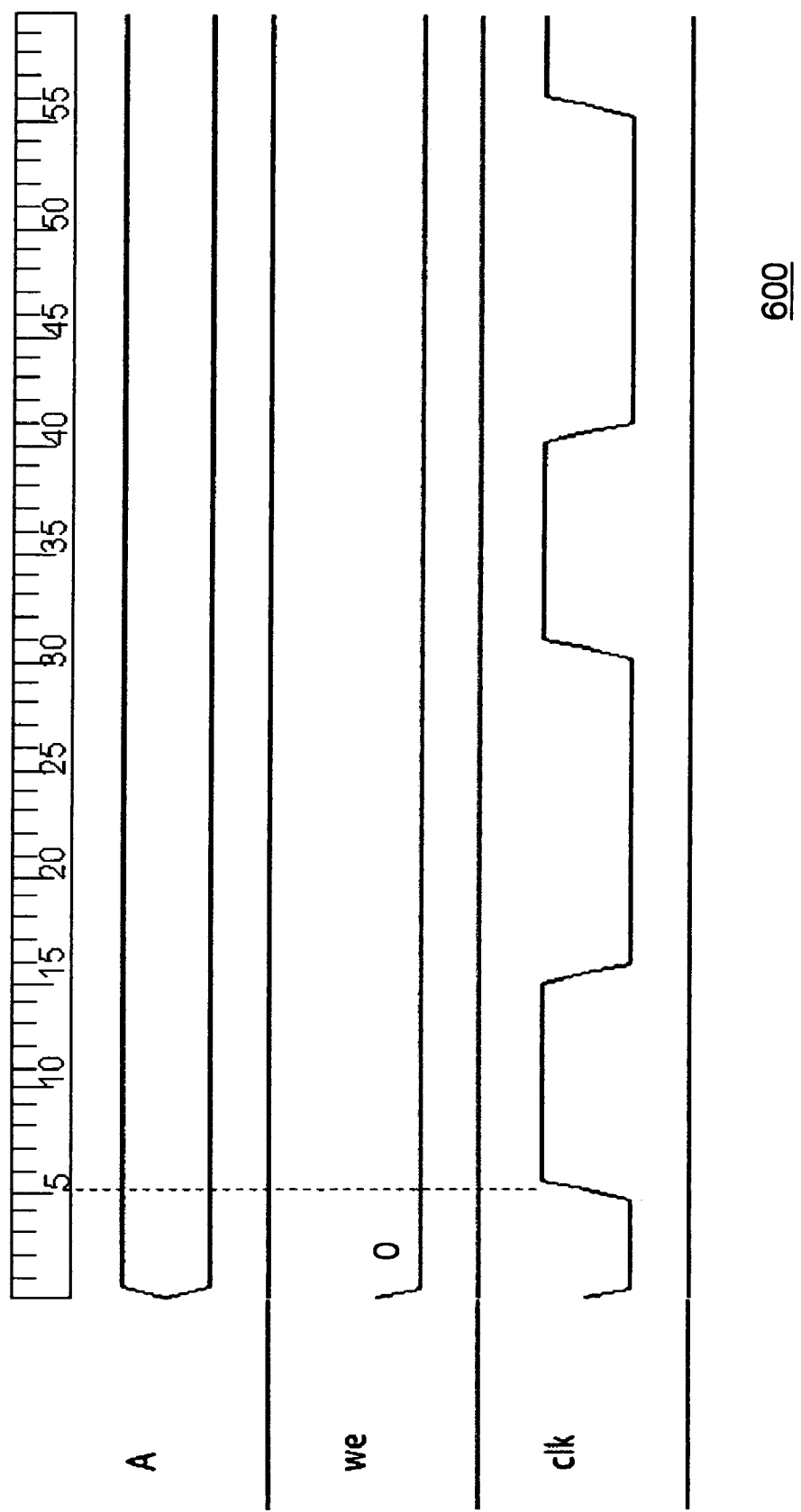
Figure 7:
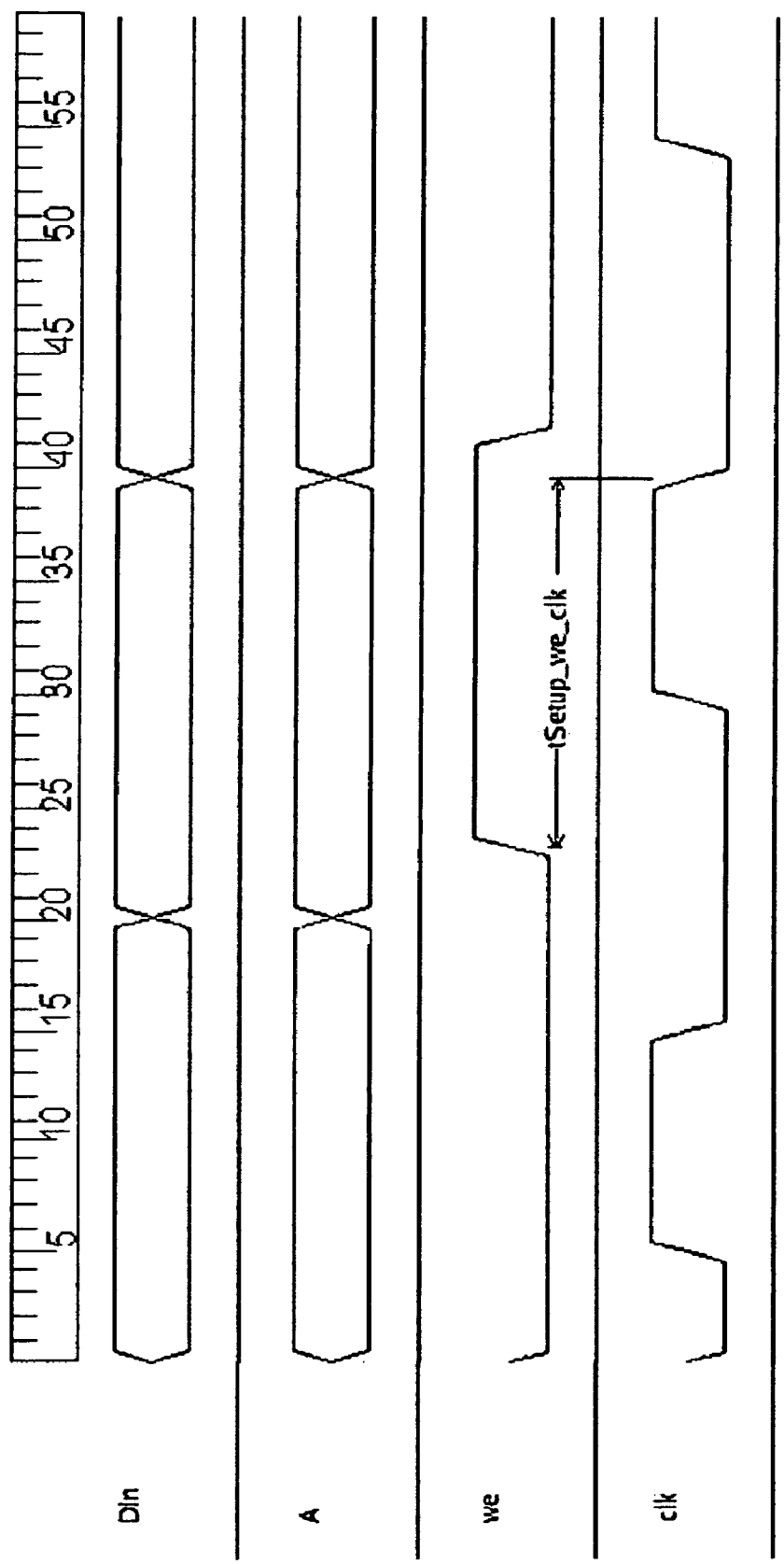

FIGS. 5, 6 and 7 illustrate exemplary outputs in accordance with an embodiment of the present invention. The instructions defined by the simulation instruction generator 204 in the MDL, to generate the output, are included in APPENDIX A. FIG. 5 illustrates an exemplary output 500 of the circuit characterization system 200 in a tabular format in accordance with an embodiment of the present invention. The exemplary output 500 includes the one or more design parameters under the heading TimingParam Name. Further, exact values of these one or more design parameters are included under the heading TimingParam_Value. The exact values are the output of the one or more simulations performed by the circuit simulator 208 on the circuit netlist file. FIGS. 6 and 7 illustrate exemplary outputs 600 and 700, respectively. The exemplary outputs 600 and 700 are in graphical format for read and write operations, respectively, in accordance with another embodiment of the present invention. APPENDIX A lists the instructions defined by the simulation instruction generator 204 in the MDL for read and write operations. In the exemplary output 600, waveform 'A' represents the address signal, waveform 'we' represents the write-enable signal, and the waveform 'cLk' represents the reference clock signal. The time mentioned in the reference scale at the top portion of the exemplary output 600 is in nano seconds (ns). As represented in the exemplary output 600, the address signal is right enabled; hence the address signal should be enabled before the high clock pulse to read the data. Further, the data is read from the IC when the waveform 'we' is zero and the address signal is enabled before the high clock pulse. For example, the data is read from the IC starting from time t=5 ns.

In the exemplary output 700, waveform 'Din' defines the data to be written in the IC, waveform 'A' represents the address signal, waveform 'we' represents the write enable signal and the waveform 'clk' represents the reference clock signal. The time mentioned in the reference scale at the top portion of the exemplary output 700 is in nano seconds (ns). As represented in the exemplary output 700, the address signal should be enabled before the high clock pulse to write data in the IC. 'Din' should be valid before the negative edge of the clock signal. The timing parameter, tsetup_we_clk, represents the setup time (amount of time before the negative edge of the clock when 'we' should be high) for the 'we' signal. It should be understood by a person ordinarily skilled in the art that the output formats discussed above are just exemplary and the output can be implemented with reference to any other suitable embodiment of the present invention.

Figure 8:
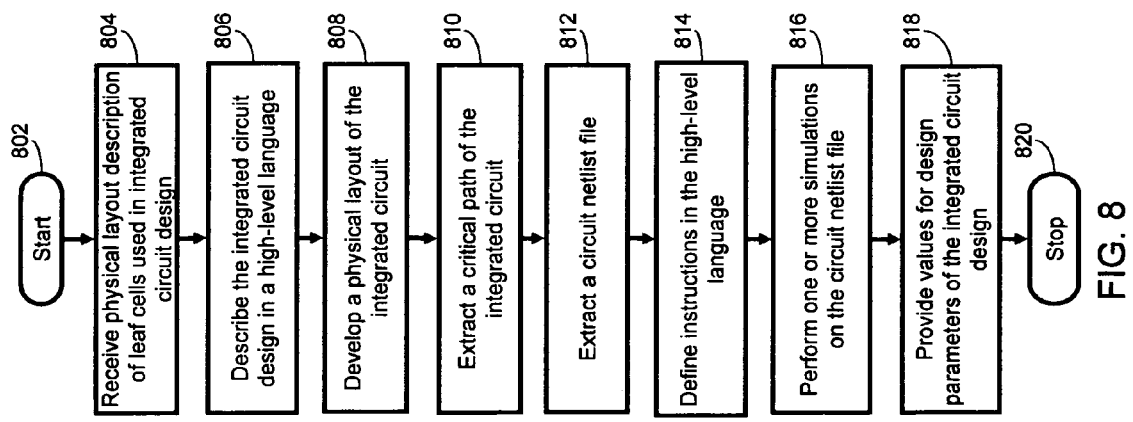
FIG. 8 is a flow diagram illustrating a method for characterizing an integrated circuit design in accordance with an embodiment of the present invention.

FIG. 8 is a flow diagram illustrating a method for characterizing an IC design in accordance with an embodiment of the present invention. To describe the flow diagram, reference will be made to FIG. 2, although it should be understood by a person ordinarily skilled in the art that the flow diagram can also be implemented with reference to any other embodiment of the present invention.

The method for characterizing the IC design is initiated at step 802. At step 804, the circuit characterization system 200 receives descriptions of the one or more leaf cells used in the IC design. At step 806, the circuit description generator 202 describes the IC design in the MDL by using the description of the one or more leaf cells. The description of the design includes specifying the placement of the one or more leaf cells and the connectivity between the one or more leaf cells. In other words, the design description in the MDL is a description of the physical layout of the design in a high-level language. At step 808, the physical layout of the IC is developed based on the IC design. At step 810, the circuit characterization system 200 extracts a critical path of the IC based on the physical layout developed of the IC. At step 812, the circuit characterization system 200 extracts a circuit netlist file based on the extracted critical path of the IC. At step 814, the simulation instruction generator 204 defines the instructions in the MDL based on the circuit netlist file extracted at step 812. These instructions are defined to perform one or more simulations on the circuit netlist file. At step 816, the circuit simulator 208 performs the one or more simulations on the circuit netlist file based on the instructions defined by the simulation instruction generator 204. These one or more simulations are performed to determine the one or more values of the one or more design parameters. In one embodiment, the one or more design parameters include one or more timing parameters or one or more power parameters. At step 818, the output generator 210 provides the values of the design parameters of the IC design in a pre-defined output format based on the one or more simulations. Thereafter, the method terminates at step 820.

Figure 9:
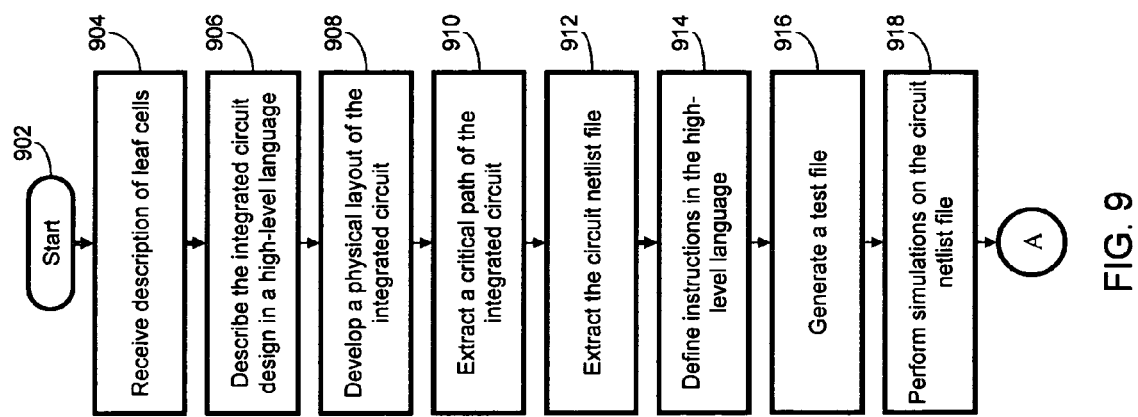
FIGS. 9, 10, and 11 are flow diagrams illustrating a method for characterizing the integrated circuit design of a design parameter in accordance with another embodiment of the present invention.
Figure 10:
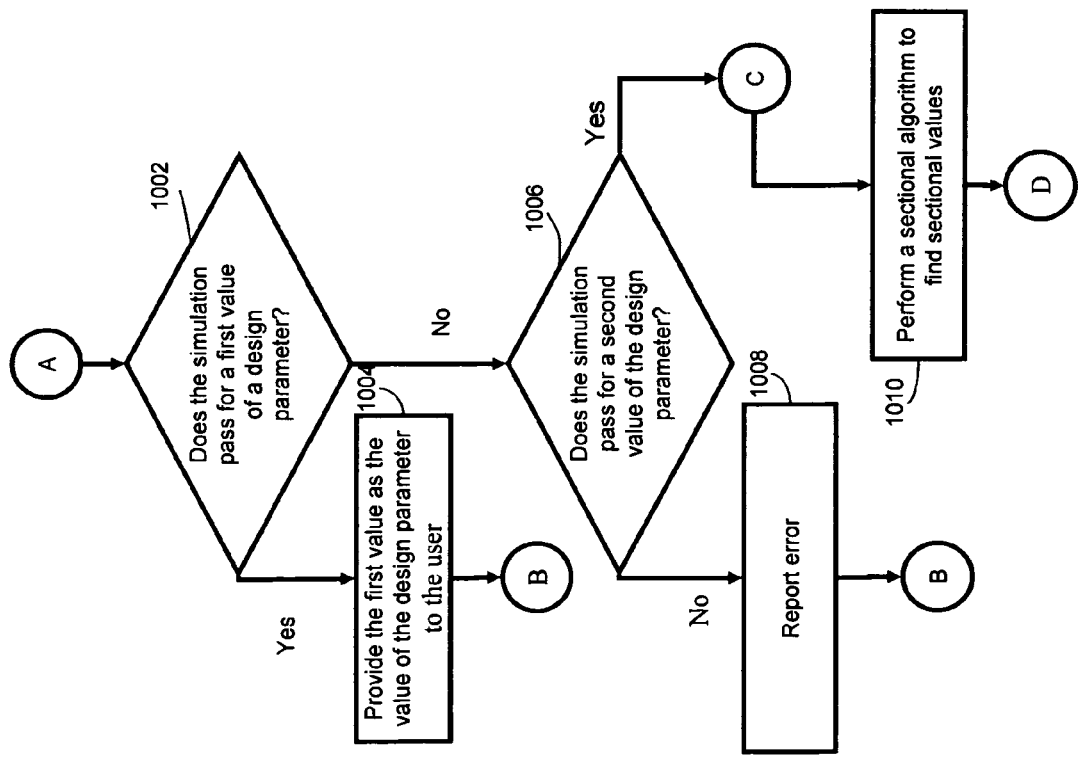
Figure 11:
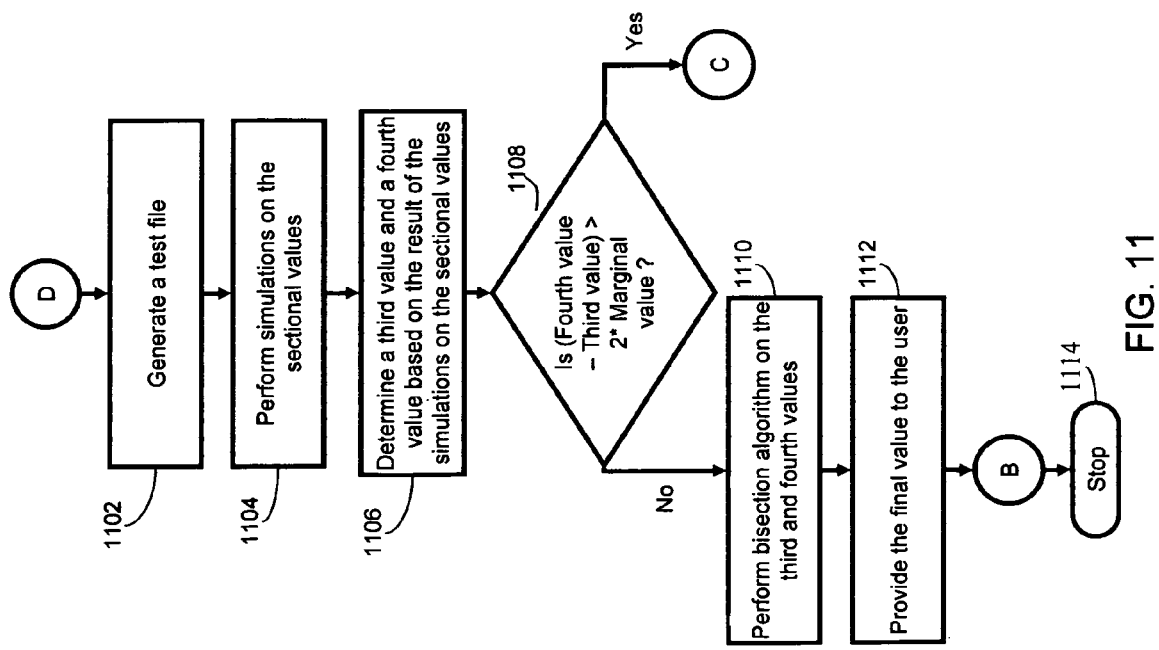

FIGS. 9, 10, and 11 are flow diagrams illustrating a method for characterizing the IC design of a design parameter in accordance with another embodiment of the present invention. To describe the flow diagrams, reference will be made to FIG. 2, although it should be understood by a person ordinarily skilled in the art that the flow diagram can also be implemented with reference to any other suitable embodiment of the present invention. The same method will be followed for other design parameters after the termination of the method for a design parameter.

The method for characterizing the IC design is initiated at step 902. At step 904, the circuit characterization system 200 receives physical layout descriptions of the one or more leaf cells. At step 906, the circuit description generator 202 describes the IC design in the MDL by using the description of the one or more leaf cells. The description of the design includes specifying the placement of the one or more leaf cells and the connectivity between the one or more leaf cells. At step 908, the physical layout of the IC is developed based on the IC design. At step 910, the circuit characterization system 200 extracts a critical path of the IC based on the physical layout developed of the IC. The critical path in the MDL is extracted by fracturing the MDL of the physical layout of the IC into three parts, the critical path MDL, the MDL of the circuit which loads the critical path, and the MDL of the rest of the IC. The circuit description generator 202 saves the connectivity information between the critical path and the circuit which loads the critical path to connect them later. This connectivity information is extracted from the physical abutment of the leaf cells at the interface between the critical path and the circuit which loads the critical path. EDA tools are used to extract a lumped-RC equivalent of the circuit which loads the critical path. The collected information is saved by the circuit description generator 202. The circuit description generator 202 then connects the critical path circuit with the lumped-RC equivalent of the circuit which loads the critical path using the connectivity information stored by the circuit description generator 202. A circuit netlist file is then extracted from the thus obtained circuit.

At step 912, the circuit characterization system 200 extracts a circuit netlist file from the circuit connected by the circuit description generator 202. At step 914, the simulation instruction generator 204 defines the instructions in the MDL based on the extracted circuit netlist file. These instructions are defined to perform one or simulations on the circuit netlist file. Defining the instructions include, but are not limited to, defining statements, a signal, clock, waveform, parameter, characterize, execute, and verify. For example, the syntax for a parameter statement is param(<param_name>, <triggering_edge>(<triggering_signal>,<edge_number>),<triggering_edge>(<reference_signal>,<edge_number>), <param_type>,<second_value>,<first_value>,<marginal_value>,<description>). The user defines a range of values for a design parameter by defining a first value and a second value of a design parameter while defining the instructions.

At step 916, the stimulus generator 206 generates a test file for performing the one or more simulations. At step 918, the circuit simulator 208 performs one or more simulations on the circuit netlist file based on the instructions defined in MDL. These simulations are performed on the first and second values of the design parameter. The first and second values of the design parameter are hereinafter referred as the best case value and the worst case value, respectively. The worst case value is the maximum value of the range and the best case value is the minimum value of the range defined by the user. For example, if the user defines a parameter statement as param(tSetup_we_clk, "we", clk, SETUP, 2, 0, 0.1), the worst case value is 2 and the best case value is 0. If the exact value of the design parameter lies between the best case value and the worst case value, the simulation fails for the best case value and passes on the worst case value. At step 1002, the circuit characterization system 200 tests whether the simulation has passed for the best case value. The output generator 210 provides the best case value as the value of the design parameter to the user at step 1004, if it is determined at step 1002 that the simulation has passed for the best case value. If the simulation has passed for the best case value, the best case value is the most appropriate value of the design parameter in the range given by the user. Hence, the output generator 210 provides the best case value as the output. Thereafter, the method terminates.

The circuit characterization system 200 determines whether the simulation has passed for the worst case value at step 1006 if it is determined at step 1002 that the one or more simulations have not passed for the best case value. The output generator 210 reports an error to the user at step 1008 if it is determined at step 1006 that the simulation has not passed for the worst case value. Since the simulation has failed for the worst case value and passed for the best case value, the exact value of the design parameter does not lie in the range defined by the user. Hence, the error is reported. Thereafter, the method terminates.

The stimulus generator 206 implements a sectional algorithm at step 1010 if it is determined at step 1006 that the simulation has passed for the worst case value. Since the simulation passed for the worst case value and failed for the best case value, the exact value of the design parameter lies in the range defined by the user. Hence, a sectional algorithm is performed to determine the exact value of the design parameter within the range defined by the user. The stimulus generator 206 evaluates the value of a sectional parameter 'k', and the range (best case value, worst case value) is divided into k sectional values in the sectional algorithm. The sectional values of the design parameter are calculated by using the sectional formula:

$$t_r = b_c + (r-1)*(w_c - b_c)/k \qquad (1)$$

where $(1 < r \leq k)$

In the sectional formula (1), $t_r$ is the $r^{th}$ value of the design parameter, $b_c$ is the best case value, and $w_c$ is the worst case value. For example, in the sectional formula (1), the sectional values of the timing parameter can be calculated for the given values $b_c=0$ ns, $w_c=2$ ns, and $k=10$. For these values, the calculated sectional values from the sectional formula (1) are $t_1=0.2$ ns, $t_2=0.4$ ns, $t_3=0.6$ ns, $t_4=0.8$ ns, $t_5=1.0$ ns, $t_6=1.2$ ns, $t_7=1.4$ ns, $t_8=1.6$ ns, $t_9=1.8$ ns.

At step 1102, the stimulus generator 206 generates a test file for performing simulation, which contains all the sectional values calculated by using the sectional formula. At step 1104, the circuit simulator 208 performs simulations for the sectional values included in the test file. At step 1106, a third value and a fourth value are determined by the circuit characterization system 200 based on the result of the simulations. If the simulation fails for $t_r$ and passes for $t_{r+1}$, then $t_r$ is the third value and the $t_{r+1}$ is the fourth value. Hence, the exact value of the design parameter lies between the third and fourth values of the design parameter. For example, if the simulation fails for $t_6=1.2$ ns and passes for $t_7=1.4$ ns, $t_6=1.2$ ns is the third value and $t_7=1.4$ ns is the fourth value of the timing parameter. The exact value of the design parameter lies between $t_6$ and $t_7$. To determine the exact value of the design parameter, a bisectional algorithm is performed over $t_6$ and $t_7$.

At step 1108, the circuit characterization system 200 tests whether the difference between the fourth and third values is greater than twice the marginal value. This marginal value is a finite value that is greater than zero, and it specifies the precision of the final outcome of the bisectional algorithm. The marginal value is defined by the user. For example, if the user defines a parameter statement as param(tSetup_we_clk, "we", clk, SETUP, 2, 0, 0.1), then the marginal value is 0.1. The circuit characterization system 200 repeats all the steps from step 1010 to step 1108 if it is determined at step 1108 that the difference between the fourth and third values is greater than twice the marginal value. The circuit characterization system 200 performs a bisectional algorithm on the third and fourth values at step 1110 to determine the final value of the design parameter if it is determined at step 1108 that the difference between the fourth and third values is not greater than twice the marginal value. For example, if the marginal value is 0.15 ns, the difference between the third value ($t_6=1.2$ ns) and the fourth value ($t_7=1.4$ ns) is not greater than twice the marginal value. Hence, the bisectional algorithm is performed on the third and fourth values. At step 1112, the output generator 210, provides the final value of the one or more design parameters to the user. For example, the bisectional algorithm performs a simulation at t=1.3 ns, since t=1.3 ns is the bisectional value of the third value ($t_6=1.2$ ns) and the fourth value ($t_7=1.4$ ns). If the simulation fails, $t_7=1.4$ ns is reported as the final value of the design parameter; otherwise, t=1.3 ns is reported as the final value. Thereafter, the method terminates at step 1114.

Various embodiments, as discussed above, provide a method and a system for characterizing an IC design. The IC design is described in Memory Description Language (MDL), which is a high-level language. The MDL is a perl-like programming language that includes a library of commands to describe the placement of leaf cells and the connectivity between the leaf cells. A circuit netlist file is extracted based on the extracted critical path of the IC. Further, a user can define instructions in the MDL to perform simulations on the extracted circuit netlist file.

The MDL helps the user to focus on defining the instructions at a higher level of abstraction in a user-friendly language instead of writing, executing and analyzing the results of a test file. In traditional characterization systems, editing requires changes being made in all the circuits of a simulation file, whereas by using the MDL, a user can easily make changes in the instructions written in the MDL. In traditional characterization systems, users have to define specific instructions for every IC. However, they can define a generic/parameterized characterization instruction in the MDL, which can be used to characterize any IC with standard circuit building blocks.

The method and system for characterizing an IC design, as described in the present invention, may be embodied in the form of a computer system. Typical examples of a computer system include a general-purpose computer, a programmed microprocessor, a micro-controller, a peripheral IC element, and other devices or arrangements of devices that are capable of implementing the steps that constitute the method of the present invention.

The computer system comprises a computer, an input device, a display unit and the Internet. The computer comprises a microprocessor, which is connected to a communication bus. The computer also includes a memory, which may include Random Access Memory (RAM) and Read Only Memory (ROM). Further, the computer system comprises a storage device, which can be a hard disk drive or a removable storage drive such as a floppy disk drive, optical disk drive, and the like. The storage device can also be other similar means for loading computer programs or other instructions into the computer system.

The computer system executes a set of instructions that are stored in one or more storage elements to process input data. The storage elements may also hold data or other information, as desired, and may be in the form of an information source or a physical memory element present in the processing machine. Exemplary storage elements include a hard disk, a DRAM, an SRAM and an EPROM. Storage elements may also be external to the computer system, and be connected to or inserted into the computer, to be downloaded at or prior to the time of use. Examples of such external computer program products include computer-readable storage mediums such as CD-ROMS, flash chips, floppy disks, and the like.

The set of instructions may include various commands that instruct a processing machine to perform specific tasks, such as the steps that constitute the method of the present invention. The set of instructions may be in the form of a software program. The software may be in various forms, such as system or application software. Further, the software may be in the form of a collection of separate programs, a program module with a larger program, or a portion of a program module. The software may also include modular programming in the form of object-oriented programming. The software program containing the set of instructions can be embedded in a computer program product, for use with a computer, with the computer program product comprising a computer-usable medium that has a computer-readable program code embodied therein. Processing of input data by the processing machine may be in response to users' commands, to the result of previous processing, or in response to a request made by another processing machine.

The modules described herein may include processors and program instructions that implement the functions of the modules described herein. Some or all the functions can be implemented by a state machine that has no stored program instructions, or in one or more application specific integrated circuits (ASICs), in which each function or some combinations of certain of the functions are implemented as custom logic.

In the foregoing specification, the invention and its benefits and advantages have been described with reference to specific embodiments. However, one with ordinary skill in the art would appreciate that various modifications and changes can be made, without departing from the scope of the present invention, as set forth in the claims. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage or solution to occur or become more pronounced are not to be construed as critical, required or essential features or elements of any or all the claims. The invention is defined solely by the appended claims, including any amendments made during the pendency of this application and all equivalents of those claims, as issued.

APPENDIX A

Sample Code
This appendix includes a sample code written in the MDL.

```
header("DEMO Placement & Netlist File in MDL");
placement
{
  block SRAM2_SUB4
  {
  print("Block Starts");
  place($SRAM_SUB4, 0, 0);
  place($SRAM_SUB4, 0, height($SRAM_SUB4), R0, MX);
  map_all(wire, PROMOTE, $SRAM_SUB4.vdd => vdd);
  map_all(wire, PROMOTE, $SRAM_SUB4.vss => vss);
  print("Block Ends");
  }
# array the bits
# 4 bits and 1 dummy cell
block TOP
{
  print("Block Starts");
  array_x(
    pattern(
      sub(4, SRAM2),
      sub(1, SRAM2_SUB4)
    ), $PC + ($PC / 4) - 1
  );
  map_oto(inout, INFER | PINBOX | PROMOTE, SRAM2.b => b[0 :
    $PC - 1], b[0 : $PC - 1]);
  map_oto(inout, INFER | PINBOX | PROMOTE, SRAM2.bb => bb[0 :
    $PC - 1], bb[0 : $PC - 1]);
  loop ($i; 2)
  {
    map_one(inout, INFER | PINBOX | PROMOTE, SRAM2.wl${i} =>
      wl${i});
  }
  map_all(wire, PROMOTE, SRAM2_SUB4.vdd => vdd);
  map_all(wire, PROMOTE, SRAM2_SUB4.vss => vss);
  print("Block Ends");
  }
}
netlist
{
  block TOP
  {
    ports {
      vdd : input;
      vss : input;
      b[$PC - 1 : 0] : input;
      bb[$PC - 1 : 0] : input;
      wl[2 : 0] : input;
    }
    connect(SRAM2_SUB4,x0,.vdd(vdd),.vss(vss));
    loop($k = 0;2) {
      connect(SRAM2,x_${k},.wl(wl[$k]));
    }
    loop($j = 0;$PC) {
      connect(SRAM2,x_${j},.b(b[$j]),.bb(bb[$j]));
    }
  }
}
characterization
{
  operation global
  {
    slew(common,RANGE,0.1,0.1,0.1);
```

APPENDIX A-continued

Sample Code
This appendix includes a sample code written in the MDL.

```
    slew(single_slew,ENUMERATED,0.1);
    load(common,RANGE,0.1,0.1,0.1);
    pulse("clk", 200, POSEDGE, 5, 10,common, NEGEDGE);
    signal(Din[0:3], INPUT,common);
    signal(A[0:1], INPUT,common);
    signal("we", INPUT, common);
    signal(Dout[0:3], OUTPUT,common);
    defaultSlew(0.1);
    defaultLoad(0.1);
    timeUnit("ns");
    loadUnit("pf");
    vth(0.2,0.8,0.2,0.8);
    customSpice(".OPTION MEASDGT=3");
    customSpice(".PARAM HSIMSPEED=1");
    customSpice(".PARAM HSIMMOSPRECISION=3");
    simulator(HSIM, "/software/HSIM/bin/hsim");
    circuitFile(HSPICE,"sram.sp");
    pvtName(first_pvt, typ, 4, 50);
    lib("./mos.hsp");
    vddTerminal(Vdd,"0");
  }
  operation write
  {
    waveform(Din[0 : 3], (0,X), (20,10), (40,0));
    waveform(A[0 : 1], (0,X), (20,1), (40,10));
    waveform(we, (0,0), (23,1), (41,0));
      param(tSetup_we_clk, POSEDGE(we, 1), NEGEDGE( clk, 2),
      SETUP, 1.000, 0.000, 0.01);
  }
  operation read
  {
    waveform(A[0:1], (0,0),(10,0));
    waveform("we", (0,0));
  }
  operation characterize_blk
  {
    $char_val = 1;
    execute(write);
    execute(read);
    verify(Dout[0:3],$char_val,100);
  }
  operation char_blk
  {
    characterize(tSetup_we_clk, characterize_blk, first_pvt);
  }
}
```

What is claimed is:

1. A method for characterizing an integrated circuit design, the method comprising:
   receiving a description of one or more leaf cells;
   describing the integrated circuit design in a high-level language using the description of the one or more leaf cells and using a computer, wherein the description of the integrated circuit design includes specifying placement of the one or more leaf cells, and specifying connectivity between the one or more leaf cells;
   developing a physical layout design based on the high-level language description;
   extracting a critical path of the physical layout design;
   extracting a circuit netlist file based on the extracted critical path;
   defining instructions in the high-level language to perform one or more simulations on the circuit netlist file;
   performing the one or more simulations on the circuit netlist file, wherein the one or more simulations are performed to determine one or more values for one or more design parameters; and
   providing the one or more values for the one or more design parameters in a pre-defined output format based on the one or more simulations.

2. The method according to claim 1, wherein the high-level language is a Memory Description Language (MDL).

3. The method according to claim 1, wherein the integrated circuit design comprises one or more memory circuits.

4. The method according to claim 1, wherein the one or more design parameters is at least one of one or more timing parameters and one or more power parameters.

5. The method according to claim 1, wherein the pre-defined output format is user-defined.

6. The method according to claim 1, wherein the instructions are defined using a Graphical User Interface (GUI).

7. The method according to claim 1, wherein performing the one or more simulations comprises:
   performing a simulation for a first value of a design parameter, wherein the first value is user-specified;
   performing a simulation for a second value of a design parameter, wherein the second value is user-specified; and
   implementing a sectional algorithm for determining at least one range of the one or more values of the one or more design parameters.

8. The method according to claim 7 further comprising generating a test file for performing the one or more simulations, wherein the one or more simulations is performed on the range of the one or more values of the one or more design parameters.

9. The method according to claim 8 further comprising:
   determining a third value of the design parameter based on the simulations on the range of the one or more values of the one or more design parameters;
   determining a fourth value of the design parameter based on the simulations on the range of the one or more values of the one or more design parameters; and
   implementing a bisectional algorithm to determine the one or more values for the one or more design parameters.

10. A circuit characterization system for characterizing an integrated circuit design, the circuit characterization system comprising;
    a circuit description generator, the circuit description generator describing the integrated circuit design in a high-level language using a description of one or more leaf cells, wherein the description of the integrated circuit design includes specifying placement of the one or more leaf cells, and specifying connectivity between the one or more leaf cells, wherein the description of the integrated circuit design includes generating a circuit netlist file based on a critical path;
    a simulation instruction generator, the simulation-instruction generator generating instructions in the high-level language based on the circuit netlist file, wherein the instructions are generated for performing one or more simulations on the circuit netlist file;
    a circuit simulator, the circuit simulator performing one or more simulations on the circuit netlist file based on instructions defined in the high-level language, wherein the one or more simulations are performed to determine one or more values for one or more design parameters; and
    an output generator, the output generator providing the one or more values in a pre-defined output format based on the one or more simulations.

11. The circuit characterization system as recited in claim 10, wherein the high-level language is a Memory Description Language (MDL).

12. The circuit characterization system as recited in claim 10, wherein the instruction generator is further capable of editing the instructions using a Graphical User Interface (GUI).

13. The circuit characterization system as recited in claim 10, wherein the integrated circuit design comprises one or more memory circuits.

14. The circuit characterization system as recited in claim 10, wherein the pre-defined output format is user-defined.

15. The circuit characterization system as recited in claim 10 further comprising a stimulus generator, the stimulus generator being capable of generating a test file for performing the one or more simulations.

16. A computer program product for characterizing an integrated circuit design, the computer program product comprising a computer readable medium comprising:
    program instructions for receiving a description of one or more leaf cells;
    program instructions for describing the integrated circuit design in a high-level language using the physical description of the one or more leaf cells, wherein the description of the integrated circuit design includes specifying placement of the one or more leaf cells, and specifying connectivity between the one or more leaf cells;
    program instructions for developing a physical layout design based on the high-level language description;
    program instructions for extracting a critical path of the physical layout design;
    program instructions for extracting a circuit netlist file based on the extracted critical path;
    program instructions for defining instructions in the high-level language to perform one or more simulations on the circuit netlist file;
    program instructions for performing the one or more simulations on the circuit netlist file, wherein the one or more simulations are performed to determine one or more values for one or more design parameters; and
    program instructions for providing one or more values for one or more design parameters of the integrated circuit design in a pre-defined output format based on the one or more simulations.

17. The computer program product as recited in claim 16, wherein the high-level language is a Memory Description Language (MDL).

* * * * *